United States Patent [19]

Schmidt et al.

[11] Patent Number: 4,935,864
[45] Date of Patent: Jun. 19, 1990

[54] LOCALIZED COOLING APPARATUS FOR COOLING INTEGRATED CIRCUIT DEVICES

[75] Inventors: William L. Schmidt, Acton, Mass.; Richard E. Olson, Rindge; Dennis J. Solley, Windham, both of N.H.

[73] Assignee: Digital Equipment Corporation, Maynard, Mass.

[21] Appl. No.: 368,741

[22] Filed: Jun. 20, 1989

[51] Int. Cl.$^5$ ............................................. H01L 25/04
[52] U.S. Cl. ...................................... 363/141; 363/147; 357/87; 357/81; 357/28; 361/386; 323/907
[58] Field of Search .................... 363/14, 141, 147; 357/81, 82, 83, 87, 28; 361/380, 381, 386, 389; 323/273, 275, 276, 907

[56] References Cited

U.S. PATENT DOCUMENTS

| 2,984,077 | 5/1961 | Gaskill . |
| 3,289,422 | 12/1966 | Fisher . |
| 3,400,543 | 9/1968 | Ross . |
| 4,238,759 | 12/1980 | Hunsperger . |
| 4,253,515 | 3/1981 | Swiatosz . |
| 4,279,292 | 7/1981 | Swiatosz . |
| 4,402,185 | 9/1983 | Perchak . |
| 4,405,961 | 9/1983 | Chow et al. . |
| 4,571,728 | 2/1986 | Yoshikawa . |
| 4,587,563 | 5/1986 | Bendell et al. . |
| 4,639,829 | 1/1987 | Ostergren et al. ............... 361/386 |
| 4,685,081 | 8/1987 | Richman . |
| 4,689,659 | 8/1987 | Watanabe . |
| 4,727,554 | 2/1988 | Watanabe . |
| 4,812,733 | 3/1989 | Tobey ................................ 357/87 |
| 4,812,949 | 3/1989 | Fontan et al. ..................... 361/386 |

Primary Examiner—Peter S. Wong
Attorney, Agent, or Firm—Charles J. Barbas; John G. Mesaros; A. Sidney Johnston

[57] ABSTRACT

A localized cooling apparatus is provided for individually cooling integrated circuit chips mounted on a circuit board for insertion into a computer backplane. The cooling apparatus consists of a circuit board occupying a first slot and having an integrated circuit chip mounted thereon, the performance of which is known to improve by cooling, a heat removal assembly consisting of a heat sink attached to a card edge portion and occupying an adjacent second slot, and a thermoelectric cooler intimately bonded to both the chip and heat removal assembly. A controller provides power via the connector of the second slot to the thermoelectric cooler and stabilizes the temperature of the chip to a predetermined value.

31 Claims, 4 Drawing Sheets

LOCALIZED COOLING APPARATUS FOR COOLING INTEGRATED CIRCUIT DEVICES

FIELD OF THE INVENTION

The invention relates to an apparatus for economically cooling individual integrated circuit devices or chips, and more specifically, very large scale integration (VLSI) chips.

BACKGROUND OF THE INVENTION

Increasing the performance of general-purpose computer systems, while lowering the cost to produce such systems, is a major challenge to computer designers and manufacturers. In fact, the price/performance ratio of a particular computer may be the decisive factor in the sale of that system. As a result, much time and money has been spent improving the technologies used to develop various digital logic integrated circuit chips used in these computers.

Complementary metal-oxide semiconductor (CMOS) logic is known for its relatively high transistor packing density. It is therefore a very popular choice for use by integrated circuit chip designers to improve the performance of their computers in, for example, the design of microprocessors. However, improvements in the CMOS fabrication process, resulting in hundreds of thousands of transistors disposed on a chip, cost millions of dollars in development expenditures. In addition, these VLSI chips generate large amounts of heat energy which must be dissipated. Emitter-coupled logic (ECL), on the other hand, is known for being one of the fastest logic families in terms of transistor switching characteristics. Yet, its power dissipation ranks among the highest of all the logic families.

Most modern CMOS chips used in general-purpose computer systems are designed to operate in 40° C. ambient temperature. When the ambient temperature increases, the operating temperature of the transistors contained within the chips increases beyond the design specification, causing thermal and chemical breakdown of the devices. Conversely, as the ambient temperature decreases within a predetermined range, the speed of the chips increases linearly. Also, the reliability of the chips increases approximately exponentially with a decrease in temperature.

Prior attempts to increase the performance of chips include utilizing liquid nitrogen cooling, conventional air cooling with heat sinks, and refrigeration. One of the more effective approaches in terms of price/performance ratio involves the use of a refrigeration system to cool an entire computer cabinet. The use of known refrigeration technology to lower the operating temperature within a cabinet can result in a substantial increase in the speed of a computer for a modest price increment, but there are reliability problems associated with this cooling technique. Since the temperature inside the cabinet is often below freezing, frosting occurs when the computer cabinet is opened for maintenance or reconfiguration of the system, creating water which could damage the electronics contained within the computer.

The insertion of CMOS chips into liquid nitrogen has approximately doubled the speed of the chips. Cryogenically cooled CMOS supercomputers, which claim a 160% speed improvement over conventional air-cooled computer systems, are commercially available. However, the liquid nitrogen cost structure is twice that of conventional air-cooling. The development and physical size of the liquid nitrogen engine and insulated flask are cost factors, as are the staff and power sources required to support such equipment. The reliability of the apparatus is also a 0 concern. Since liquid nitrogen cooling involves both mechanical and electrical interconnection of various components, the mean time between failure of the nitrogen engine and related parts is substantially lower than that of conventional air-cooling techniques.

An attempt has been made to utilize a Peltier device as a means for controlling the temperature of a bubble memory within a narrow temperature band. One arrangement is shown in U.S. Pat. No. 4,685,081 issued to Richman on Aug. 4, 1987, entitled "Peltier Junction Used For Thermal Control Of Solid State Devices."

In an alternate method for cooling in a computer environment, a computer cabinet will include a fan which provides air-cooling, the fan being located at a position for directing air over and through the circuit boards with appropriate ventilation being provided in the cabinet. However, the heat energy dissipated by a VLSI chip is too great for sufficient cooling by direct air thermal transfer.

Therefore, a problem encountered with computer systems is cooling or lowering the ambient temperature in which the computer system, or more specifically the individual integrated circuit chips, operate in order to improve the overall performance of the computer.

Also, a problem facing computer designers concerns increasing the speed and reliability of CMOS integrated circuits in an economical manner, such that the chips exhibit the speed associated with ECL logic, while retaining the high transistor packing density characteristic of CMOS logic.

SUMMARY OF THE INVENTION

It is therefore a feature of the present invention to provide a new and improved method and apparatus of localized cooling of complex CMOS integrated circuit chips, so as to economically increase their performance and reliability in conventional, low-velocity, air-cooled computer environments.

Also, in accordance with an aspect of the invention, it is a feature to provide a new and improved method and apparatus of localized cooling that takes advantage of circuit board packaging and space constraints due to heat dissipation of VLSI CMOS integrated circuit chips used in modern computer systems.

A further feature of the invention is to provide a new and improved method and apparatus of localized cooling using thermoelectric means for removing heat from a VLSI CMOS integrated circuit chip and improving the performance of the chip, whose performance is known to improve when operating at cool temperatures.

The foregoing and other features of the invention are accomplished by providing a computer card-cage which includes a backplane mounted therein, the backplane consisting of at least two adjacent slots and associated connectors, the connectors configured to provide electrical power. A circuit board having an integrated circuit chip mounted thereon occupies a first connector and slot, and a heat removal assembly consisting of a heat sink attached to a card edge portion occupies an adjacent second connector and slot. A thermoelectric means is intimately bonded to the chip and heat removal assembly. The thermoelectric means has opposing planar sides and is capable of creating a temperature difference between its sides in response to electrical power supplied by the connectors.

In an alternate embodiment, features of the invention are further accomplished by providing a card-cage in a computer cabinet, the card-cage including a backplane having a plurality of adjacent slots with connectors and card guides for receiving circuit board card edges. At least one CMOS chip with a planar surface is mounted on one side of a circuit board. The board is dimensioned and configured for connection to or insertion in, via one set of card guides, one of the plurality of connectors. A heat removal assembly has a card edge portion and a heat sink, the assembly being dimensioned and configured for having the card edge portion thereof inserted, via a second set of card guides, into an adjacent one of the plurality of connectors in facing relation with the circuit board side containing the chip. A thermoelectric cooler, having first and second opposing sides, the first side being a cold surface and the second side being a hot surface with the thermoelectric cooler energized, is employed in a manner such that its first side is in intimate thermal transfer relation with the planar surface of the CMOS chip, while its second side is in intimate thermal transfer relation with a first surface of a heat spreader. The second surface of the heat spreader is also arranged in intimate thermal transfer relation with the heat sink. A controller is utilized to provide power to the thermoelectric cooler, such that the first side of the thermoelectric cooler is maintained at a specified temperature.

Other objects, features and advantages of the invention will become apparent from a reading of the specification when taken in conjunction with the drawings, in which like reference characters refer to like elements in the several views.

DESCRIPTION OF THE PREFERRED EMBODIMENTS

Figure 1:
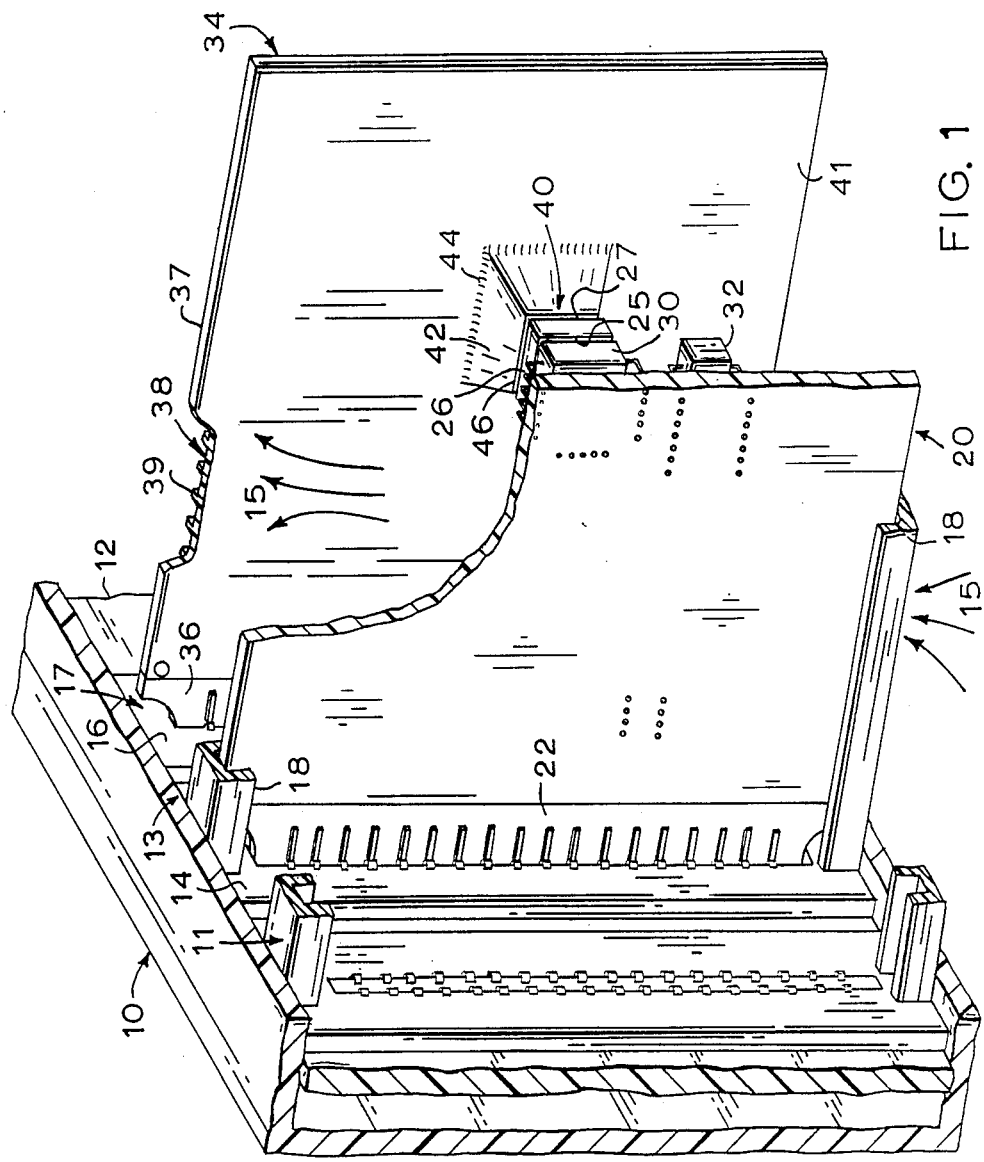
FIG. 1 is a partial perspective view, partially broken away, of a first embodiment of the cooling apparatus according to the invention.

Referring now to FIG. 1, there is shown a partial perspective view of the interior of a computer card-cage 10, which is of the type typically installed in a low velocity, air-cooled computer cabinet, and having parts which are eliminated for clarity and shown as broken sections. Numerous similar designs for card-cages may be employed without deviating from the inventive concepts described herein as would be apparent to one of ordinary skill in the art. In a conventional computer card-cage 10, there is a backplane 12 having a plurality of adjacent slots 11, 13, 17. Slots 11, 13, 17 include a plurality of spaced, aligned, vertically-mounted, electrical connectors, two adjacent ones of which have been designated by reference numerals 14,16, the connectors being of conventional design and configured for receipt in the female openings thereof, of card edge portion 22 of circuit board 20, for example a printed circuit board. In accordance with such conventional connectors, a plurality of spaced, aligned, gold-plated conductive members, some of which provide electrical power, are arranged in a spring-like configuration and are normally employed in opposing pairs. Other types of connectors could, of course, be used without deviating from this invention. In accordance with card-cage 10, a set of upper and lower card guides 18 are affixed in a perpendicular relation to backplane 12 and a front portion of card-cage 10 (not shown), the guides 18 being affixed in a spaced, generally parallel relationship and having longitudinally extending, slotted rails and adapted for receiving therein the upper and lower edges of circuit board 20.

Circuit board 20 has an integrally formed card edge portion 22 configured for connection to or insertion into connector 14. Mounted on circuit board 20 is a CMOS integrated circuit device or chip 30. With respect to circuit board 20, chip 30 is shown facing to the right of FIG. 1, with the exposed side of circuit board 20 being that surface which contains the conductive etch path members and the opposite, component side including chip 30 and other electronic components, for example component 32. Of course, component 32 may be mounted on either side of circuit board 20.

Chip 30 may be a VLSI CMOS chip containing, as a minimum and by way of example only, central processing unit, floating point unit, and cache control unit functionality all within the integrated circuit package. Chip 30 may also include additional memory functionality as technology evolves. Yet, advances in the CMOS fabrication process, while increasing the component density on integrated circuit chips, also increase the amount of heat generated by the chips. It will be apparent to those skilled in the art that other technologically similar integrated circuit devices may utilize the advantages of the invention. Nevertheless, for present technology, such devices are in the context of high power dissipation devices. Chip 30 may, for example, dissipate power, or heat energy, in the realm of twelve to eighteen watts.

In accordance with the invention, in order to improve the Performance of such high power VLSI CMOS chips, localized cooling apparatus 40 is provided, such apparatus including thermoelectric means, such as a Peltier device or thermoelectric cooler 26, and heat removal assembly means, for example a heat removal assembly 34. Thermoelectric cooler 26 is affixed to the outer planar surface of chip 30, which is in a generally parallel relation to the component side of circuit board 20. Cooler 26 for use in this particular application has an area dimension, that is width and length, approximately less than or equal to the area of the package encapsulating chip 30, since modern chip packages are often larger than the area occupied by the chip itself, in which case cooler 26 is positioned directly over the actual area occupied by chip 30. Cooler 26 has opposing generally planar surfaces, referred to as hot side 27 and cold side 25, specified such that the application of power creates a temperature difference, for example 40° C., across cooler 26, thereby allowing the transfer of heat energy from cold side 25 to hot side 27. Accordingly, cold side 25 of thermoelectric cooler 26 is attached to the outer surface of chip 30 in thermal contact, such as intimate thermal transfer relation, that is, the generally planar surfaces of cold side 25 and chip 30 are secured under sufficient contact pressure, or by any other suitable means, to ensure efficient transfer of heat between chip 30 and cooler 26. Contact pressure may be achieved in a number of ways, including insertion of a plurality of holes, preferably four, into circuit board 20 and around chip 30, and then clamping board 20 to heat removal assembly 34. Alternately, known metal-filled wax or silicon rubber may be used to bond the surfaces of cold side 25 and chip 30, and fill any voids that would otherwise exist. Such wax or rubber aids in lowering contact resistance between surfaces that are not absolutely planar.

As will hereinafter be described, the electrical power for cooler 26 is derived from a source readily available in backplane 12, e.g. five and twelve volts, without the necessity of modifying circuit board 20.

Heat removal assembly 34 includes a card edge portion 36, configured as a partial circuit board, for connection to or insertion into a connector 16 of backplane 12, and heat sink means, for example a heat sink 38. Card edge 36 and heat sink 38 are flexibly attached in a manner that allows for the alignment and centering of assembly 34 into card guides (not shown), and for the lateral movement and alignment of card edge 36 with connector 16 during insertion into backplane 12. Heat sink 38 is formed of suitable thermal conducting material, such as aluminum, and is of a generally plate-shaped configuration approximately equal to the dimensions of a printed circuit board, with a first side 37 consisting of protruding fins or ribs 39 for enhancing heat transfer due to the flow of air across its surface. In a preferred embodiment of the invention, a second opposing side 41 of heat sink 38 has a frusto-pyramidal, laterally projecting portion 42, including a base 44 integrally formed to second side 41, and a top 46, having a planar surface which extends towards cooler 26. The planar surface forming top 46 is generally identically configured and matched in dimension to hot side 27 of thermoelectric cooler 26, which is attached to top 46 in intimate thermal transfer relation by any suitable means.

Figure 2:
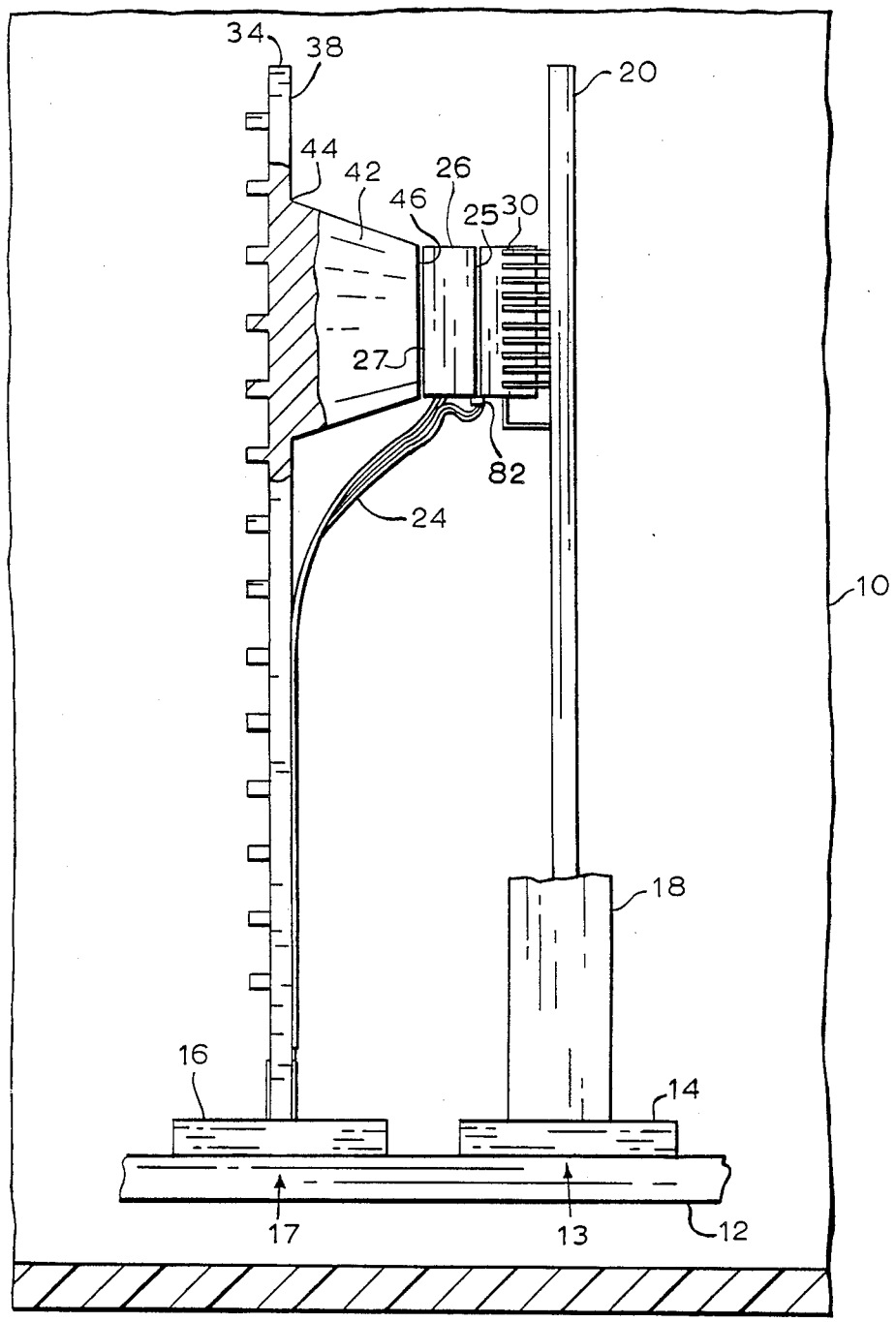
FIG. 2 is a plan view of the apparatus of FIG. 1, as viewed from the top thereof.

FIG. 2 shows the apparatus of FIG. 1 viewed from the top to illustrate the spacing of the circuit board 20 and heat removal assembly 34 using two adjacent slots of backplane 12. The improved packaging apparatus of the invention preferably utilizes adjacent slots, for example slots 13,17 of backplane 12, which typically measures 0.8 inches from the center of one connector to the center of an adjacent connector, such that heat removal assembly 34 is inserted into a connector in facing relation to the component side of circuit board 20. Frusto-pyramidal portion 42 of heat sink 38 functions not only as a thermal conductor but as a spacer, compensating for the gap between thermoelectric cooler 26 and heat removal assembly 34, yet does not unduly restrict air flow through card-cage 10, using an insignificant portion of the clearance gap between board 20 and assembly 34.

As described above, frusto-pyramidal portion 42 also functions as a thermal conductor and, as such, could be designed in other tapered configurations, extending outwardly from base 44 to top 46 at a 45° angle to maximize the transfer of heat energy between chip 30 and heat sink 38. Chip 30, for example a multifunction, VLSI CMOS integrated circuit, dissipates large amounts of heat energy, for example twelve to eighteen watts, while thermoelectric cooler 26, being of proper specification to transfer such heat, dissipates an additional amount of energy, for example 25 to 35 watts. As such, one advantage of the present invention is the provision of a heat sink 38, having a greater surface area than conventional solid state, air-cooling arrangements, the greater surface area enabling dissipation of the large amounts of heat energy generated by chip 30 and cooler 26, and then transferred by cooler 26 to heat sink 38. Additionally, the packaging of the present invention is such as to slidably fit into allocated space in a standard, commercial backplane 12. Card guides (not shown) provide structural support for assembly 34 when inserted into backplane 12, while connector 16 can provide a readily available source of electrical power utilized by thermoelectric cooler 26 to create a temperature difference across cooler 26.

A thermal sensor 82 is securely attached in intimate thermal transfer relation at the juncture of the outer surface of chip 30 and the cold side 25 of thermoelectric cooler 26. As will be hereinafter described, the physical placement of thermal sensor 82 was chosen to provide sensing of the temperature of chip 30, while cable 24 provides electrical connection from sensor 82 and cooler 26 to an electrically conductive means.

Figure 3:
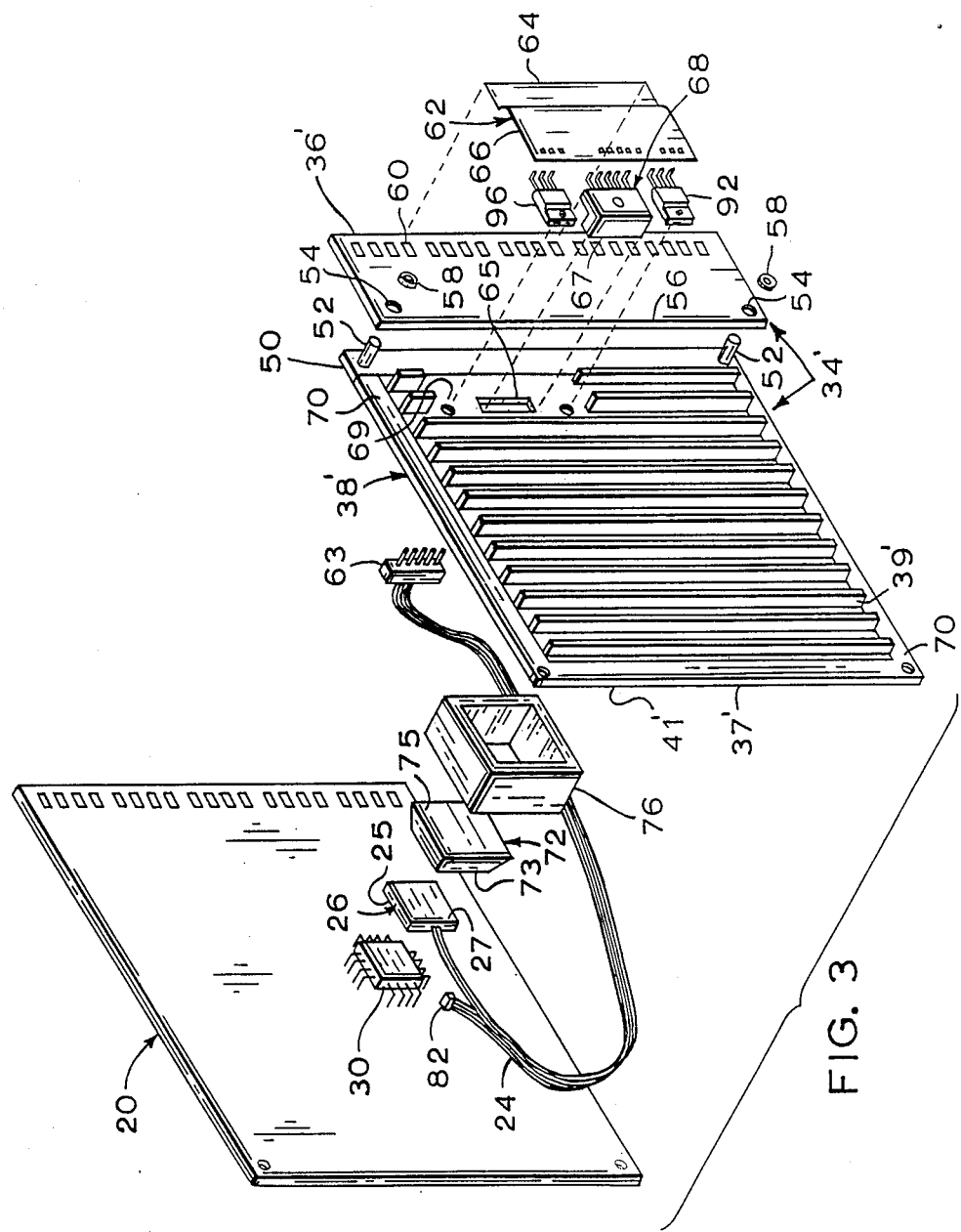
FIG. 3 is an exploded perspective view of an alternate embodiment of the invention as viewed in a direction opposite that of FIG. 1.

In FIG. 3, there is an exploded perspective view of an alternate embodiment of the invention in a direction opposite that of FIG. 1, illustrating the mating relationship of circuit board 20 and heat removal assembly 34', while emphasizing in exploded relation the constituent parts.

In this embodiment, heat sink 38' of assembly 34' is formed to define a forward, bar-shaped portion 50 having upper and lower fasteners, such as dowel pins 52, which are positioned for passing through apertures 54 adjacent to an edge 56 of elongated, generally rectangular card edge 36'. Heat sink 38' is flexibly attached to card edge 36' by spring washers 58 clamped over dowel pins 52 to provide a slight amount of lateral movement which will enable contact fingers 60 of card edge 36' to find their way into the appropriate adjacent slot connector during insertion of assembly 34' into backplane 12.

Figure 4:
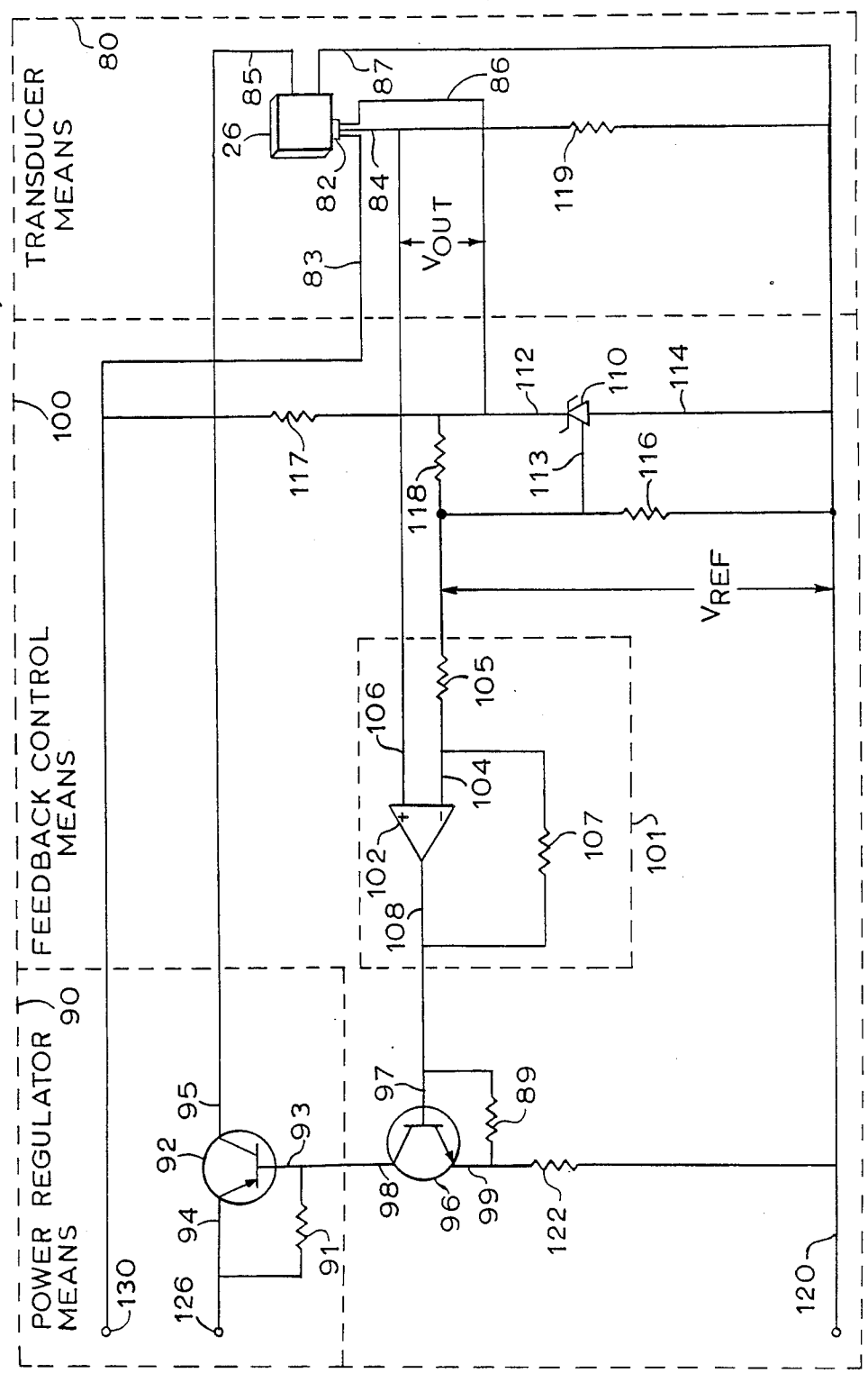
FIG. 4 is a detailed circuit schematic of a controller used to regulate the power and temperature of a thermoelectric cooler used with the apparatus of FIGS. 1 and 3.

To provide a flexible interconnection between heat sink 38' and card edge 36', electrically conductive means, such as flex circuit 62, is provided and contains the electronic circuitry needed to supply power to cooler 26. Flex circuit 62 is attached at a first end 64 to card edge 36, such that power and ground are provided from contact fingers 60, and is attached at a second end 66 to heat sink 38'. Series pass transistor 92 and drive transistor 96 are physically coupled to end 66 of circuit 62 for attachment to heat sink 38'. Heat sink 38' includes a recessed, rectangular planar portion 69, from which ribs 39' have been removed, for enabling this attachment. Additionally, terminal block 68 is physically coupled to end 66 and configured for insertion into and through aperture 65, which is located on recessed portion 69 of heat sink 38'. Terminal block 68 provides at least five electrical connections from flex circuit 62 for electrical connection to thermoelectric cooler 26 and thermal sensor 82. Accordingly, a cable 24 is provided, such that sensor 82 and cooler 26 are coupled via cable 24 to a five-pin male connector 63, which when connected to a female connector portion 67 of terminal block 68 provides electrically conductive relation to flex circuit 62. Referring also to FIG. 4, cable 24 will contain at least three connections (83, 84, and 86) from sensor 82 and two connections (85 and 87) from cooler 26.

A first side 37' of heat sink 38' consists of a protruding, rib-like configuration in which ribs 39' are generally identically designed in a spaced, parallel manner, as shown more clearly in FIG. 3, and arranged in a vertical direction. The vertical arrangement is substantially parallel to airflow in such computer cabinets, from bottom to top, as illustrated in FIG. 1 by the direction of arrows 15. Unlike heat sink 38 of the first embodiment, in this embodiment of the invention, second side 41' (not shown) of heat sink 38' is flat and generally planar, while upper and lower edges 70 of heat sink 38' are relieved of ribbing to provide edges for insertion into upper and lower card guides of card-cage 10.

In this embodiment heat spreader means, for example a separate heat spreader member 72, is provided for heat transfer and to fill the gap between circuit board 20 and assembly 34' when inserted into adjacent slots in backplane 12. Heat spreader 72 is made of solid, isotropic, thermal conducting material and designed in a tapered configuration, extending outwardly from bottom 75 to top 73 at a 45° angle, thereby increasing the amount of surface area available for the transfer of heat energy, so that the heat transfer coefficient between the air and ribs 39, becomes less critical. Both top 73 and bottom 75 of spreader 72 have generally planar surfaces to provide low thermal contact resistance when secured in intimate thermal transfer relation to hot side 27 of cooler 26 and side 41' of heat sink 38', respectively. It is preferred that the dimensions of top 73 of spreader 72 are generally identical to the dimensions of hot side 27 of cooler 26, to which it is attached.

In order to provide thermal efficiency, a thermal blanket or cover 76 is provided and made of insulating material and designed to a generally rectangular, tapered construction, having a hollow interior, so as to closely surround heat spreader 72, thermoelectric cooler 26, and chip 30. Cover 76 deters lateral heat energy loss from hot side 27 of thermoelectric cooler 26, so that the heat generated by chip 30 is transferred directly to heat spreader 72, while also preventing condensation and ice formation on cold side 25 of cooler 26.

FIG. 4 depicts a detailed circuit schematic of a controller 150, which includes the interconnecting flex circuit 62 and thermal sensor 82. Controller 150 is designed to provide continuous power to cooler 26, such that the temperature of cold side 25 of cooler 26, which is in intimate thermal transfer relation to chip 30 (see FIG. 1), is maintained at a specified temperature independent of the power consumed by chip 30 and the ambient operating temperature of cooling apparatus 40.

Controller 150 provides three functions to localized cooling apparatus 40, these functions being designated in FIG. 4 by broken lines as transducer means 80, power regulator means 90, and feedback control means 100. First, controller 150 provides control function sensing, such as temperature sensing, to accurately track the temperature of chip 30. For this purpose, a transducer, for example thermal sensor 82, is securely attached in intimate thermal transfer relation at the juncture of the outer surface of chip 30 and cold side 25 of thermoelectric cooler 26. Of course, it will be apparent to those skilled in the art that the control function referred to above may represent any state variable of the computer system, e.g. current, voltage, pressure, displacement, or temperature, without deviating from the inventive concepts described herein. Sensor 82, preferably one of the National Semiconductor LM35 series, is selected due to the resolution (10 mV/° C.), accuracy (1.0° C.), linearity, temperature range ($-55°$ to $+155°$ C.), and voltage range (4 to 30 volts) the device provides, although it will be apparent to those skilled in the art that comparable devices may be used. Second, controller 150 provides power regulation by drawing electrical power from backplane 12 and processing the power prior to delivery to cooler 26. Power regulator means 90 may be a linear or switch-mode type power supply. Third, controller 150 provides feedback control means 100 for the electrical power transferred from power regulator means 90 to cooler 26. A portion of the feedback control means 100 has been delineated by broken lines and functions as a DC gain block 101, which compares an error signal from thermal sensor 82 to a reference signal $V_{ref}$ and generates an amplified signal to power regulator means 90 to stabilize the temperature of chip 30 at a predetermined value.

As mentioned, the specifications of thermal sensor 82 are such that at a predetermined value, for example 0° C., no voltage is present across its output, and for every degree of temperature variation from the predetermined value sensed at its input, a relatively large, corresponding electrical error signal (10 mV/° C.) is produced at its output. The error signal, proportional to the temperature deviation from the predetermined value, is derived by placing the output voltage $V_{out}$ (voltage across leads 84 and 86 of sensor 82) in series opposing relation with a floating DC reference voltage $V_{ref}$ derived via resistor 118 and resistor 116, and a programmable reference element 110, preferably a Motorola TL431. Thus, when the combination $V_{out}$ and $V_{ref}$ is at 0 volts, the circuit is at equilibrium and when the combination is not at 0 volts, the error signal is amplified by DC voltage amplifier 102, preferably a Motorola LM358.

Structurally, inverting input 104 of amplifier 102 is connected via resistor 105, preferably 1K ohms, to the junction of resistors 116 and 118, and output 113 of reference 110, which is specified at 2.495 volts. Non-inverting input 106 of amplifier 102 is directly linked to lead 84 of sensor 82, while lead 86 of sends 82 is connected to the junction of cathode 112 of reference 110 and resistor 117, which in turn is tied to input voltage source 130. Voltage source 130, preferably twelve volts, is provided to sensor 82 via lead 83 Lead 84 is tied to ground 120 via resistor 119, preferably 50K ohms, while anode 14 of reference 110 is also tied to ground 120. Feedback resistor 107, preferably 200K ohms and connected between inverting input 104 and output 108 of amplifier 102, establishes a DC gain of 46 db and a bandwidth of 3 KHz.

In accordance with the invention and application of the localized cooling apparatus 40, power regulator means 90 is arranged in a linear topology, consisting mainly of a PNP bipolar, series pass transistor 92, which has a low saturation voltage, for example 200-300 mV. Output 108 of voltage amplifier 102 feeds base 97 of drive transistor 96, which is configured as a transconductance amplifier, while collector 98 of drive transistor 96 is connected to base 93 of series pass transistor 92, and emitter 99 of drive transistor 96 is tied both to ground 120 via resistor 122, and to base 97 via resistor 89. Likewise, emitter 94 of series pass transistor 92 is connected directly to power source 126 and to base 93 via resistor 91, while collector 95 of transistor 92 is directly interfaced to thermoelectric cooler 26 by way of lead 85. Lead 87 provides a ground connection for cooler 26. This overall configuration offers defined control of the base current available to series pass transistor 92.

In accordance with the invention, application of localized cooling apparatus 40 to remove heat from chip 30 and cool chip 30 to a predetermined value, for example 0° C., is as follows. Assuming that chip 30 is operating at 40° C. ambient temperature, the output voltage of thermal sensor 82 is 400 mV, causing a substantial increase in the voltage at output 108 of amplifier 102. As such, maximum base current will flow in drive transistor 96, limited only by the selection of resistor 122. Likewise, maximum current is drawn from power source 126 through the series pass transistor 92 and down to ground 120. Series pass transistor 92 is driven into saturation, whereby substantially all of the voltage of power source 126, for example five volts, will appear across thermoelectric cooler 26. This causes cold side 25 of cooler 26 to approach 0° C., while removing heat from the chip 30 into cooler 26, and then to heat removal assembly 34.

At this point, output 108 of voltage amplifier 102 drops to approximately 2.5 volts and the base current provided to series transistor 92 is reduced. The voltage across cooler 26 also drops to a nominal value. Since output 108 of amplifier 102 can swing approximately +/−2 volts around the nominal 2.5 volts and the DC gain of amplifier 102 is designed for 46 db, a +/−10 mV change at the input to amplifier 102 will cause series pass transistor 92 to be driven to saturation or cut off, respectively. As output voltage $V_{out}$ of temperature sensor 82 is specified at 10 mV per degree C, it follows that the feedback 20 control means 100 will maintain cold side 25 of cooler 26 within +/−1° C. of the predetermined value, or 0° C.

The combination of programmable reference 110, used to generate a floating DC reference voltage, and thermal sensor 82, together with differential input DC gain block 101 and drive transistor 96 forms a unique, stable control mechanism which varies the power supplied to thermoelectric cooler 26 via series pass transistor 92. The temperature of cold side 25 of cooler 26, and thus chip 30, can be maintained at a predetermined value (0° C.) and controlled within a predetermined range (+/−1° C.), which is set by the gain of DC gain block 101. Also, if the sensed temperature falls outside of this range, controller 150 will drive the circuit towards equilibrium at maximum rate because series pass transistor 92 will be driven into saturation or cut-off. Finally, there is no interaction between the thermal time constant and electrical time constant of controller 150, due to its wide 3 KHz bandwidth.

The embodiments herein described enable the use of a VLSI CMOS integrated circuit device, mounted on an unmodified circuit board, to be cooled to 40° C. below ambient temperature, thereby increasing its performance by approximately 25% by addition of an efficient localized cooling apparatus.

It will therefore be apparent to those skilled in the art that various changes and modifications in the specifically described embodiments can be carried out without departing from the scope of the invention which is intended to be limited only by the scope of the appended claims.

What is claimed is:

1. Localized cooling apparatus for cooling an integrated circuit chip mounted on a circuit board configured for connection to a first connector of a backplane having a plurality of connectors, said apparatus comprising:
   heat removal assembly means for connection to a second connector of said plurality of connectors; and
   thermoelectric means having first and second sides, said thermoelectric means being capable of creating a temperature difference between said sides in response to electrical power supplied thereto via said second connector, said first side being attached in thermal contact to said chip and said second side being attached in thermal contact to said heat removal assembly means to transfer heat generated by said chip to said heat removal assembly means.

2. The localized cooling apparatus of claim 1 wherein said second connector is adjacent to said first connector.

3. The localized cooling apparatus of claim 2 wherein said heat removal assembly means includes heat sink means and a card edge portion.

4. The localized cooling apparatus of claim 3 wherein said card edge portion is attached to electrically conductive means, said card edge portion configured for connection to said second connector.

5. The localized cooling apparatus of claim 4 further including thermal sensor means for producing an output signal proportional to the temperature of said chip and wherein said electrically conductive means comprises:
   power regulation means coupled to said thermoelectric means; and
   feedback control means, including a DC reference 48 8 voltage and a DC gain block for comparing said output signal to said DC reference voltage and generating an amplified signal, and further including a drive transistor responsive to said amplified signal for driving said power regulation means for controlling electrical power to said thermoelectric means.

6. The localized cooling apparatus of claim 1 further including means in circuit relation with said thermoelectric means and said second connector for enabling the regulating of power to said thermoelectric means.

7. The localized cooling apparatus of claim 1 wherein said first side of said thermoelectric means is a cold side and said second side of said thermoelectric means is a hot side.

8. The localized cooling apparatus of claim 7 wherein said chip has a generally planar surface and said cold side of said thermoelectric means has a generally planar surface, and both of said generally planar surfaces are secured to each other in intimate thermal transfer relation.

9. The localized cooling apparatus of claim 8 Wherein said heat sink means has a generally planar surface and said hot side of said thermoelectric means has a generally planar surface, and both of said generally planar surfaces are secured to each other in intimate thermal transfer relation.

10. The localized cooling apparatus of claim 4 wherein said heat sink means includes a heat sink having a tapered portion.

11. The localized cooling apparatus of claim 10 wherein said first side of said thermoelectric means is a cold side and said second side of said thermoelectric means is a hot side.

12. The localized cooling apparatus of claim 11 wherein said tapered portion of said heat sink has a generally planar surface and said hot side of said thermoelectric means has a generally planar surface, and both of said generally planar surfaces are secured to each other in intimate thermal transfer relation.

13. The localized cooling apparatus of claim 1 wherein said thermoelectric means is a thermoelectric cooler.

14. The localized cooling apparatus of claim 1 wherein said chip is a VLSI, CMOS integrated circuit chip.

15. An apparatus for cooling complex integrated circuit chips mounted on one of a plurality of printed circuit boards configured for insertion into a card-cage having a backplane with a plurality of adjacent slots, each of said slots including a connector for providing electrical power, the apparatus comprising:
   a printed circuit board for insertion into a first card-cage slot, said printed circuit board including at least one complex integrated circuit chip mounted thereon, said chip generating heat energy in response to electrical power supplied thereto by the connector of said first card-cage slot;
   a heat removal assembly for insertion into a card-cage slot adjacent to said printed circuit board, said assembly including a heat sink and a card edge portion for insertion into the connector of said adjacent card-cage slot, said card edge portion being attached to electrically conductive means; and
   a thermoelectric cooler, said cooler having a cold side and a hot side and being capable of creating a temperature difference between said sides in response to electrical power supplied thereto, said cold side of said cooler being attached in intimate thermal transfer relation to said chip and said hot side of said cooler being attached in intimate thermal transfer relation to said heat sink, said cooler being in electrically conductive relation with said electrically conductive means for enabling application of power to said cooler with said card edge portion inserted into said connector, whereby heat energy generated by said chip is transferred by said thermoelectric cooler and dissipated by said heat sink.

16. The apparatus of claim 15 wherein said chip has a generally planar surface and said cold side of said thermoelectric cooler has a generally planar surface, and both of said generally planar surfaces are secured in intimate thermal transfer relation.

17. The apparatus of claim 16 wherein said heat sink has has a frusto-pyramidal, tapered portion.

18. The apparatus of claim 17 wherein said heat sink has dimensions approximately equal to said printed circuit board.

19. The apparatus of claim 18 wherein said tapered portion of said heat sink has a generally planar surface and said hot side of said thermoelectric cooler has a generally planar surface, and both of said generally planar surfaces are secured in intimate thermal transfer relation.

20. The apparatus of claim 19 wherein said electrically conductive means includes a flex circuit for providing power to said thermoelectric cooler.

21. The apparatus of claim 20 wherein said thermoelectric cooler is a Peltier device.

22. The apparatus of claim 21 wherein said chip is a VLSI, CMOS integrated circuit chip.

23. In an apparatus for use in a card-cage of a computer cabinet, the card-cage including a backplane having a plurality of adjacent slots with connectors having female openings for receiving circuit board card edges, each of said slots including a set of first and second spaced, generally parallel card guides, said apparatus comprising:
   a circuit board having electronic components on one side thereof, said circuit board being dimensioned and configured for insertion, via one set of said card guides, into one of said connector female openings, at least one of said components being a CMOS integrated circuit chip, said CMOS chip having an outer planar surface in generally parallel relation to said one side of said circuit board;
   a heat removal assembly having a card edge portion, said assembly including a heat sink, said assembly being dimensioned and configured for having said card edge portion thereof inserted, via a second set of said card guides into an adjacent one of said connector female openings in facing relation with said one side of said circuit board;
   a thermoelectric cooler having first and second opposing generally planar sides, said first side being a cold surface and said second side being a hot surface with said thermoelectric cooler energized, said first side being in intimate thermal transfer relation with said planar surface of said CMOS chip;
   a thermal sensor securely attached at the juncture of said outer surface of said chip and said first side of said cooler;
   a heat spreader having a first surface in intimate thermal transfer relation with said second side of said thermoelectric cooler and a second surface in intimate thermal transfer relation with said heat sink; and
   a flex circuit attached to said card edge portion and said heat sink, said flex circuit coupled to said thermal sensor and said thermoelectric cooler in electrically conductive relation for regulating the power supplied to said thermoelectric cooler and stabilizing the temperature of said chip.

24. The apparatus of claim 23 further comprising:
   a cover having a hollow interior for surrounding said heat spreader, said thermoelectric cooler and said chip, said cover deterring lateral heat energy loss from said thermoelectric cooler and directing heat energy generated by said chip directly to said heat spreader.

25. A controller for regulating the electrical power supplied to a thermoelectric means secured in intimate thermal transfer relation to an integrated circuit chip, such that the temperature of said chip is maintained at a predetermined value, said controller comprising:
   power regulation means coupled to said thermoelectric means;
   thermal sensor means for producing an output signal proportional to the temperature of said chip; and
   feedback control means, including a DC reference voltage and a DC gain block for comparing said output signal to said DC reference voltage and generating an amplified signal, and further including a drive transistor responsive to said amplified signal for driving said power regulation means for regulating electrical power to said thermoelectric means.

26. The controller of claim 25 wherein said DC reference voltage is generated using a programmable reference element.

27. The controller of claim 26 wherein said drive transistor is a transconductance amplifier.

28. The controller of claim 27 wherein said power regulation means includes a series pass, PNP bipolar transistor arranged in a linear topology.

29. The controller of claim 28 wherein said thermal sensor means includes a thermal sensor secured in intimate thermal transfer relation to at least one of said chip and said thermoelectric means.

30. The controller of claim 29 wherein said DC reference voltage is placed in series opposing relation with said output signal.

31. A method for locally cooling an integrated circuit chip mounted on a circuit board configured for insertion into a backplane having a plurality of adjacent connectors for providing electrical power, the method comprising:

securing a first side of a thermoelectric cooler to said chip;

securing a second side of said thermoelectric cooler to a heat removal assembly having a card edge portion and a heat sink, said card edge portion attached to electrically conductive means coupled in electrically conductive relation to said thermoelectric cooler; and creating a temperature difference across said sides of said thermoelectric cooler in response to electrical power supplied thereto by said electrically conductive means, whereby heat energy generated by said chip is transferred by said thermoelectric cooler and dissipated by said heat sink.

* * * * *